United States Patent [19]

Estes, Jr.

[11] Patent Number: 5,013,931
[45] Date of Patent: May 7, 1991

[54] PROGRAMMABLE TRIANGLE WAVE GENERATOR

[75] Inventor: Earl M. Estes, Jr., Tucson, Ariz.

[73] Assignee: Hughes Aircraft Company, Los Angeles, Calif.

[21] Appl. No.: 271,475

[22] Filed: Nov. 15, 1988

[51] Int. Cl.⁵ .............................................. H03K 5/00
[52] U.S. Cl. .................................... 307/261; 307/228; 307/264; 307/271; 307/282; 307/494; 328/181; 328/34; 328/35; 328/36
[58] Field of Search ............... 307/228, 261, 494, 264, 307/271, 282; 328/181, 127, 34-36

[56] References Cited

U.S. PATENT DOCUMENTS

| | | | |
|---|---|---|---|
| 3,333,117 | 7/1967 | Carter | 307/88.5 |
| 3,405,286 | 10/1968 | Mudie | 307/228 |
| 3,610,952 | 10/1971 | Chandos | 307/228 |
| 4,363,025 | 12/1982 | Jackson | 328/181 |
| 4,516,038 | 5/1985 | Glennon | 307/228 |
| 4,524,334 | 6/1985 | Brajder et al. | 307/228 |
| 4,550,263 | 10/1985 | Layton | 328/181 |
| 4,585,951 | 4/1986 | Wurzburg | 328/181 |
| 4,611,176 | 9/1986 | Jatko et al. | 328/181 |
| 4,651,025 | 3/1987 | Smeulers | 328/181 |

FOREIGN PATENT DOCUMENTS 1524285 1/1970 Fed. Rep. of Germany .
3220553 12/1983 Fed. Rep. of Germany ...... 307/228

OTHER PUBLICATIONS

Electronic Design; Hauser; "Square-to Triangle-Wave Converter Provides Constant Amplitude"; 11/77, pp. 160-161.

Primary Examiner—Stanley D. Miller
Assistant Examiner—T. Cunningham
Attorney, Agent, or Firm—R. M. Heald; R. A. Hays; W. Denson-Low

[57] ABSTRACT

A triangle wave generator (10) which is programmable, and which provides variable amplitude, frequency independent, triangle waves over a wide frequency bandwidth while employing a low voltage power source. The triangle wave generator (10) comprises a square wave input signal source (12) and a reference voltage signal source (14). A first amplifier (16) amplifies the square wave input signals and couples them by way of a transformer (34) to an integrator (36,40) which generates triangle wave output signals in response thereto. A second amplifier (18) connected to the triangle wave signal and to the transformer coupled square wave current source for the purpose of providing a bootstrap. A third amplifier (20) samples and compares the triangle wave output signals to the reference voltage signals and generates output error signals in response thereto. A driver circuit (22) responds to the output error signals and provides bias voltage signals to the first amplifier (16) that controls the amplitude of the square wave output signals in proportion to the amplitude of the reference voltage signals. The triangle waves are controlled in a manner to cause their amplitude to be proportional to the amplitude of the reference voltage signals and independent of the frequency of the square wave input signals. The triangle wave generator (10) produces a 20 volt peak-to-peak amplitude triangle wave at frequencies greater than 300 KHz utilizing a conventional ±15 volt power supply source. A nonprogrammable, fixed frequency embodiment and a method of producing triangle wave signals are also disclosed.

9 Claims, 4 Drawing Sheets

PROGRAMMABLE TRIANGLE WAVE GENERATOR

BACKGROUND OF THE INVENTION

The present invention relates generally to triangle wave generators and more particularly to a programmable triangle wave generator which provides variable amplitude, frequency independent, triangle waves over a wide frequency bandwidth while utilizing a low voltage power source.

Triangle wave generators are commonly used in switched mode servo amplifiers, and the like, as part of their pulse width modulation section. For example, such switched mode servo amplifiers are typically used in powering torquer motors which are used to control the position of gimbals, optical elements, and other such elements which require stabilization or position control.

The current state of the art in switched mode servo amplifiers is pushing the operational requirements of triangular wave generators to higher and higher frequencies. Although there is the requirement for higher frequency operation, the systems employing these devices utilize relatively low housekeeping power supply voltages. Such voltages are in the rage of ±15 volts, which are the typical voltages made available for use by operational amplifiers, and the like. Conventional triangle wave generators have been unable to provide relatively high amplitude triangle waves at high frequency due primarily to this power supply limitation.

SUMMARY OF THE INVENTION

In order to overcome the limitations of conventional triangle wave generators, the present invention provides for a triangle wave generator which is programmable, and which produces variable amplitude, frequency independent, triangle waves over a wide frequency bandwidth while utilizing a relatively low voltage power source.

The present invention utilizes a square wave input signal source and a variable amplitude reference voltage signal source. A first amplifier is coupled to the square wave signal source which amplifies the signals provided thereby. An integrator, which includes a resistor and capacitor, generates triangle wave output signals in response to the amplified square wave current output signals. A second amplifier is employed as a buffer for the triangle wave thus generated and provides a bootstrap for the amplified square wave signal. A third amplifier samples and compares the triangle wave output signals to the reference voltage signals and generates output error signals in response thereto.

A fourth amplifier may be employed to correct for triangle wave asymmetry about a nominal zero voltage level. A driver circuit may also by employed to buffer the output error signals and provide bias voltage signals to the first amplifier. This driver circuit controls the amplitude of the square wave current output signals in proportion to the amplitude of the reference voltage signals. The triangle wave output signals are thus controlled such that their amplitude is proportional to the amplitude of the reference voltage signals and independent of the frequency of the square wave current signals.

In addition, a fixed voltage embodiment is disclosed which comprises a fixed frequency square wave signal source which is coupled to an amplifier whose output is transformer coupled to the output of the circuit. A second amplifier having a unity gain configuration is coupled across the secondary of the transformer. The second amplifier buffers the output and provides for a fixed frequency triangle wave output signal as an output from the circuit.

The present invention also contemplates a method of generating triangle wave signals. The method in accordance with the present invention includes the steps of providing a source of square wave input signals and a source of reference voltage signals. The method then comprises generating triangle wave output signals in response to the amplified square wave current output signals. This is accomplished using a partial bootstrapping technique which provides improved triangle wave amplitude and linearity. Next, the method comprises sampling and comparing the triangle wave output signals to reference voltage signals and then generating output error signals in response thereto. Finally, the method comprises generating bias control signals in response to the output error signals to control the amplitude of the amplified square wave current output signals. The amplitude of the square wave output signals is thus proportional to the amplitude of the reference voltage signal, which in turn controls the amplitude of the triangle wave output signals.

BRIEF DESCRIPTION OF THE DRAWING

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
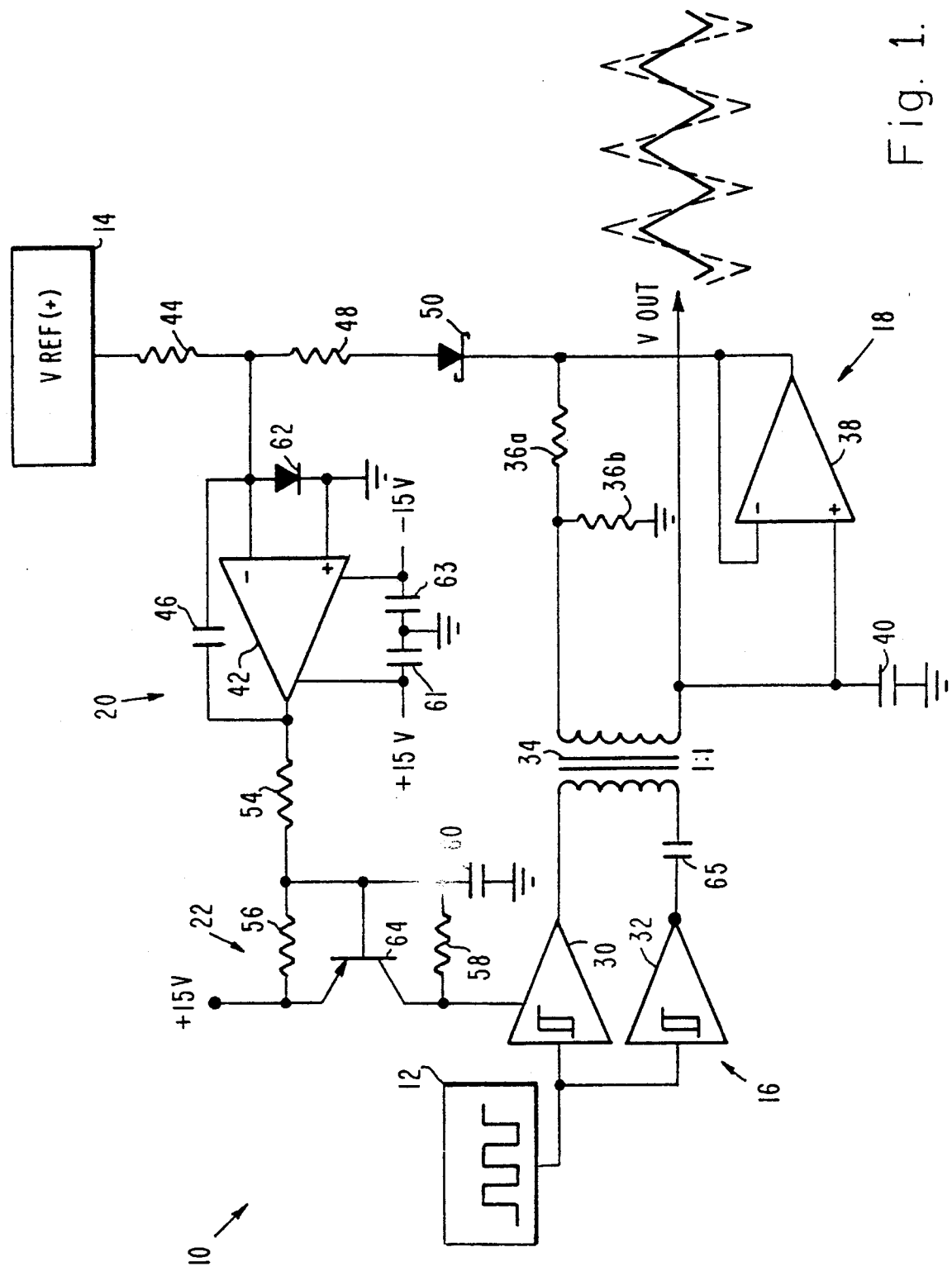
FIG. 1 illustrates a first embodiment programmable triangle wave generator which embodies the principles of the present invention.

Referring to FIG. 1, a first embodiment of a programmable triangle wave generator 10 in accordance with the principles of the present invention is shown. The generator 10 includes a square wave current signal source 12 and a variable amplitude reference voltage signal source 14. A first amplifier 16 is coupled to the square wave input signal source 12 and is adapted to amplify the square wave signals. An integrator, comprised of a resistor network 36 including resistors 36a, 36b and a capacitor 40, is coupled across the output of a transformer 34 and produces a triangle wave signal in response to the amplified square wave from the secondary of the transformer 34. A second amplifier 18 is coupled across the secondary of the transformer 34 and provides a buffer for the triangle wave output signal, and in conjunction with the resistor network 36, provides a partial bootstrap for the amplified square wave signal.

A third amplifier 20 is provided which samples and compares the triangle wave output signals to reference voltage signals provided by the reference voltage source 14 and generates output error signals in response thereto. Although not absolutely required in all applications, a driver circuit 22 is provided which is responsive to the output error signals and provides bias voltage signals to the first amplifier 16. The bias voltage signals control the amplitude of the amplified square wave output signals in proportion to the amplitude of the reference voltage signals. The triangle wave output signals are controlled in a manner that causes their amplitude to be proportional to the amplitude of the reference voltage signals and independent of the frequency of the square wave input signals.

The details of the triangle wave generator 10 are as follows. The first amplifier 16 is comprised of a noninverting amplifier 30 and an inverting amplifier 32 having their respective inputs coupled to the square wave input source 12 and having respective noninverting and inverting outputs coupled to a primary winding of the transformer 34. The second amplifier 18 comprises an operational amplifier 38 having a unity gain configuration and having the two resistors 36a, 36b coupled between the output thereof and the secondary of the transformer 34 to provide a partial bootstrap. The opposite end of the secondary of the transformer 34 is coupled to a capacitor 40 and to a positive input of the operational amplifier 38. The voltage across the secondary of the transformer 34, is impressed across resistor network 36, and forms a current source to charge the capacitor 40 in synchronism with the square wave voltage across the transformer 34. This is intended to develop the triangle wave output signal in response to the amplified square wave signal. The first operational amplifier 38 is employed as a buffer for the triangle wave that appears across the capacitor 40.

The third amplifier 20 is comprised of a second operational amplifier 42 having its inverting input coupled to the variable amplitude reference voltage source 14 and also having its inverting input coupled to the output of the first operational amplifier 38 by means of a resistor 48 and a first diode 50. The reference voltage input to the second operational amplifier 42 is also coupled to its output through capacitor 46, thus forming an integrator which responds to the difference in average current flowing in resistors 44 and 48. The output is also coupled to the driver circuit 22. A second diode 62 is coupled between the inputs of the second operational amplifier 42 to prevent possible damage thereto. The driver circuit 22 comprises a transistor 64 having its emitter coupled to a 15 volt bias voltage supply and having its collector coupled to capacitor 60 and to the first amplifier 16.

The various other interconnection details of the triangle wave generator 10 will not be described due to their clear presentation in FIG. 1.

The operation of the triangle wave generator 10 of FIG. 1 is as follows. The square wave input signal is amplified by the noninverting amplifier 30 of the first amplifier 16 and inverted and amplified by the second amplifier 32 thereof. A triangle wave output signal is developed across the capacitor 40. This triangle wave is buffered by the operational amplifier 38 to form a partial bootstrap circuit. The two resistors 36a, 36b provides attenuation in the feedback of the first operational amplifier 38 and also provides the desired amount of resistance in series with the secondary winding of the transformer 34 to insure that a square wave current signal is coupled to the capacitor 40.

The buffered triangle wave signal at the output of the first operational amplifier 38 is sampled and compared with the reference signal at the input of amplifier 20 which produces an error signal in proportional thereto. This error signal drives the driver circuit 22. The driver circuit 22 controls the bias voltage applied to the first amplifier 16 and thus controls the amplitude of its square wave output signal. In turn, this controls the amplitude of the triangle wave output signal. Control of the triangle wave output signal in this manner cause the amplitude of the triangle wave to be proportional to the reference voltage and independent of the frequency of the square wave.

The first amplifier 16 may be comprised of a TSC428 dual MOSFET driver, while the second and third amplifiers may be comprised of separate halves of a TL072 dual operational amplifier. The transistor 64 employed in the driver circuit 22 may be a 2N2907 A transistor device. The balance of the parts employed in the triangle wave generator 10 are as follows: Identifying numerals are provided in this list and the parts are similarly identified in the FIG. 1, although they have not been discussed in detail. In particular, capacitor 40 has a value of 560 pf, resistor 44 has a value of 255 K ohm, capacitor 46 has a value of 0.01 $\mu$f, resistor 36a has a value of 2.15 K ohm, resistor 36b has a value of 15.0 K ohm, capacitor 70 has a value of 0.1 $\mu$f capacitors 60 and 65 have a value of 0.1 $\mu$f, resistor 48 has a value of 6.04 K ohm, resistor 54 has a value of 10.0 K ohm, resistor 56 has a value of 309 ohm and resistor 58 has a value of 10.0 K ohm.

Test results for the triangle wave generator 10 indicate that for an input voltage range of +30 volts to +75 volts for the reference voltage source 14, and a square wave frequency of from 180 KHz to 400 KHz, the ratio of input voltage to triangle wave amplitude changed from 10.7 to 9.09. This corresponds to a range of open loop gain in a servo amplifier coupled to receive the triangle wave output of ±8 percent. A conventional triangle wave generator would have introduced a ±81 percent range in open loop gain. In addition, the triangle wave generator 10 produces a 14 volt peak-to-peak amplitude triangle wave at 400 KHz utilizing a conventional ±15 volt power supply source.

In addition, the triangle wave generator 10 produces a 20 volt peak to peak amplitude triangle wave at 300 KHz utilizes a conventional ±15 volt power supply source. It is believed that no other currently available triangle wave generator can match this performance over this combination of amplitude and frequency ranges using such a low voltage power supply.

The programmability of the triangle wave generator 10 is achieved due to the ability to vary the input reference voltage and achieve a corresponding amplitude variation in the output triangle wave. It incorporates closed loop stabilization employing the unity gain second amplifier 18. The triangle wave output provides for synchronization of a host switched mode servo amplifier coupled to the square wave signal source, which comprises an external clock signal, for those applications which require frequency synchronization for reduction of electromagnetic interference. The amplitude of the triangle wave output signal is independent of the frequency of the square wave input signal which facilitates synchronization to a variable frequency signal source.

Figure 2:
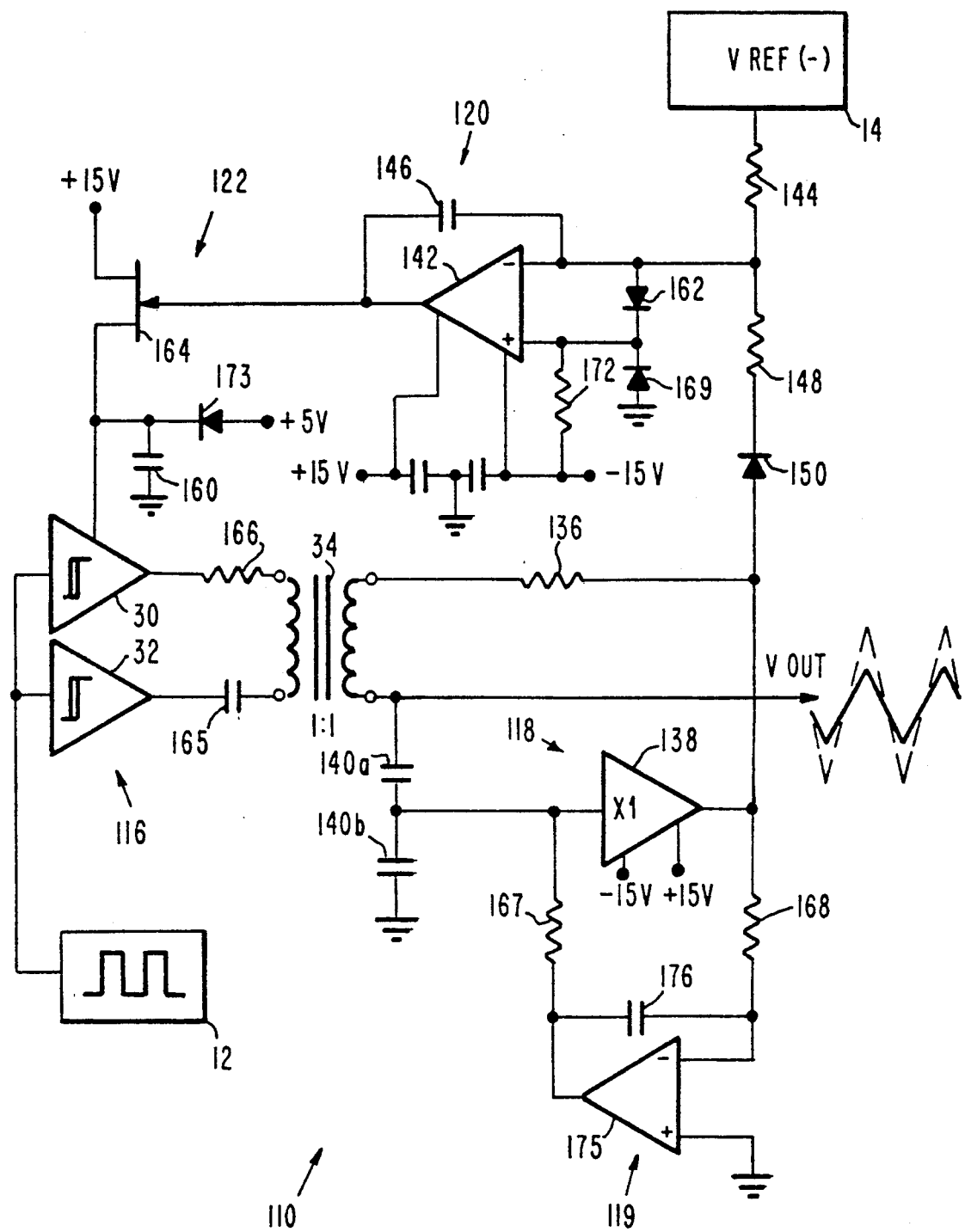
FIG. 2 illustrates a second embodiment of a programmable triangle wave generator in accordance with the present invention.

Referring to FIG. 2, a second embodiment of a programmable triangle wave generator 110 in accordance with the principles of the present invention is shown. The structural details of the second embodiment are substantially the same as those disclosed with reference to FIG. 1, with the following additions and modifications. A fourth amplifier 119 is provided which samples the average voltage at the output of the second amplifier 118 and corrects for any asymmetry about zero volts. The capacitive coupling to the second amplifier 118 is slightly modified as indicated in FIG. 2. Minor changes and additions to the third amplifier 120 are also included as indicated in FIG. 2. The driver circuit 122 comprises a junction field effect transistor circuit. Other minor changes to the circuit of FIG. 1 are provided and will be discussed below.

In general, then, the generator 110 includes a square wave signal source 12 and a reference voltage signal source 14. A first amplifier 116 is coupled to the square wave input signal source 12 and is adapted to amplify the square wave signals. An integrator comprised of a resistor 136 and two capacitors 140a 140b and coupled across the output of a transformer 34 produces a triangle wave signal in response to the amplified square wave from the secondary of transformer 34. A second amplifier 118 is provided which buffers an attenuated portion of the triangle wave output signal and provides a bootstrap for the amplified square wave signal. A third amplifier 120 is provided which samples and compares the triangle wave output signals to reference voltage signals provided by the reference voltage source 14 and generates output error signals in response thereto.

A fourth amplifier 119 is provided which samples the average voltage at the output of the second amplifier 118 and corrects for any asymmetry about zero volts. A driver circuit 122 is responsive to the output error signal and provides bias voltage signals to the first amplifier 116. These bias voltage signals control the amplitude of the amplified square wave output signals in proportion to the amplitude of the reference voltage signals. The triangle wave output signals are controlled in a manner that causes their amplitude to be proportional to the amplitude of the reference voltage signals and independent of the frequency of the square wave input signals.

The details of the triangle wave generator 110 are as follows. The first amplifier 116 is comprised of a noninverting amplifier 30 and an inverting amplifier 32 having their respective inputs coupled to the square wave input source 12 and having respective noninverting and inverting outputs resistively and capacitively coupled to a primary winding of the transformer 34. The second amplifier 118 comprises a first operational amplifier 138 having a unity gain configuration and having a resistor 136 coupled between the output thereof and the secondary of the transformer 34. The opposite end of the secondary of the transformer 34 is coupled to a capacitive voltage divider comprised of the capacitors 140a 140 b.

The voltage across the secondary of the transformer 34, is impressed across the resistor 136, and forms a current source to charge the capacitors 140a, 140b in synchronism with the square wave voltage across the transformer 34. This is intended to develop the triangle wave output signal in response to the amplified square wave signal. The first operational amplifier 138 is employed as a buffer for the portion of the triangle wave that appears across capacitor 140b.

Oscillation of first operational amplifier 138 is prevented by the fact that capacitors 140a, 140b form an attenuator, thus providing less that 100% feedback from output to noninverting input, while providing about 88% bootstrapping for the current source to improve triangle wave amplitude and linearity.

The fourth amplifier 119 is comprised of a second operational amplifier 175 connected to a capacitor 176 and resistor 168 which receives its input from the output of first operational amplifier 138. This arrangement forms an integrator, which responds to the average voltage at the output of the second amplifier 118. An error signal generated thereby is coupled through a resistor 167 to the input of the first operational amplifier 138 to cause any zero offset in the average voltage at the output of the first operational amplifier 138 to be nulled.

The third amplifier 120 is comprised of a third operational amplifier 142 having its inverting input cooled to the variable amplitude reference voltage source 14 and also having its inverting input coupled to the output of the first operational amplifier 118 by means of a resistor 148 and a first diode 150. The reference voltage input to amplifier 142 is also coupled to its output through capacitor 146, thus forming an integrator which responds to the difference in average current flowing in resistors 144 and 148. The output is also coupled to the driver circuit 122. A second diode 162 is coupled between the inputs of the third operational amplifier 142 to prevent possible damage thereto. A third diode 169 and resistor 172 are connected to the noninverting input of the third operational amplifier 142. The resistor 172 is also connected to a voltage source, thus causing a current to flow through diode 169 to provide a bias which compensate for the forward voltage drop across the first diode 150. The driver circuit 122 comprises a junction field effect transistor 164 having its drain coupled to a 15 volt bias voltage supply and having its source coupled to capacitor 160 and to the first amplifier 116.

The various other interconnection details of the triangle wave generator 110 will not be described due to their clear presentation in FIG. 2.

The operation of the triangle wave generator 110 of FIG. 2 is as follows. The square wave input signal is amplified by the noninverting amplifier 30 of the first amplifier 116 and inverted and amplified by the second amplifier 32 thereof. A triangle wave output signal is developed across the capacitors 140a, 140b and is attenuated by their voltage divider ratio. This attenuated triangle wave is buffered by the first operational amplifier 138 to form a partial bootstrap circuit. The resistor 136 serves two functions. It isolates the output of the first operational amplifier 138 from the interwinding capacitance of transformer 34 and also provides the desired amount of resistance in series with the secondary winding of the transformer 34 to insure that a square wave current signal is coupled to the capacitors 140a, 140b.

The buffered triangle wave signal at the output of the first operational amplifier 138 is sampled and compared with the reference signal at the input of amplifier 120 which produces an error signal in proportion thereto. This error signal drives the driver circuit 122. The driver circuit 122 controls the bias voltage applied to the first amplifier 116 and thus controls the amplitude of its square wave output signal. In turn, this controls the amplitude of the triangle wave output signal. Control of the triangle wave output signal in this manner causes the amplitude of the triangle wave to be proportional to the reference voltage and independent of the frequency of the square wave.

The first amplifier 116 may be comprised of a TSC428 dual MOSFET driver, while the second amplifier may be comprised of an HA-5002 current buffer. The third and fourth amplifiers may be comprised of separate halves of a TL072 dual operational amplifier. The field effect transistor 164 employed in the driver circuit 122 may be a 2N4391 transistor device. The balance of the parts employed in the triangle wave generator 110 are identical to those used in the circuit of FIG. 1 but additionally include the following. The resistor 167 is 150 K ohm, resistor 168 is 100 K ohm, the diode 173 is a 1N4150 and capacitor 176 is 0.01 µf.

Test results for the triangle wave generator 110 indicate that for an input voltage range of −40 volts to −65 volts for the reference voltage source 14, taken simultaneously with a square wave frequency of from 200 KHz to 300 KHz, the ratio of input voltage of triangle wave amplitude changed from 10.2 to 9.9. This corresponds to a range of open loop gain in a servo amplifier coupled to receive the triangle wave output of ±2 percent. A conventional triangle wave generator would have introduced a ±72 percent change in open loop gain.

In addition, the triangle wave generator 110 produces a 20 volt peak to peak amplitude triangle wave at 300 KHz utilizing a conventional ±15 volt power supply source. Again, it is believed that no other currently available triangle wave generator can match this performance over this combination of amplitude and frequency ranges using such a low voltage power supply.

As in the circuit of FIG. 1, the programmability of the triangle wave generator 110 is achieved due to the ability to vary the input reference voltage and achieve a corresponding amplitude variation in the output triangle wave. It incorporates closed loop stabilization employing the unity gain second amplifier 118. Also, the triangle wave output provides for synchronization of a switched mode servo amplifier to the square wave signal, which comprises an external clock signal, for those applications which require frequency synchronization for reduction of electromagnetic interference. The amplitude of the triangle wave output signal is independent of the frequency of the square wave input signal which facilitates synchronization to a variable frequency signal source.

Figure 3:
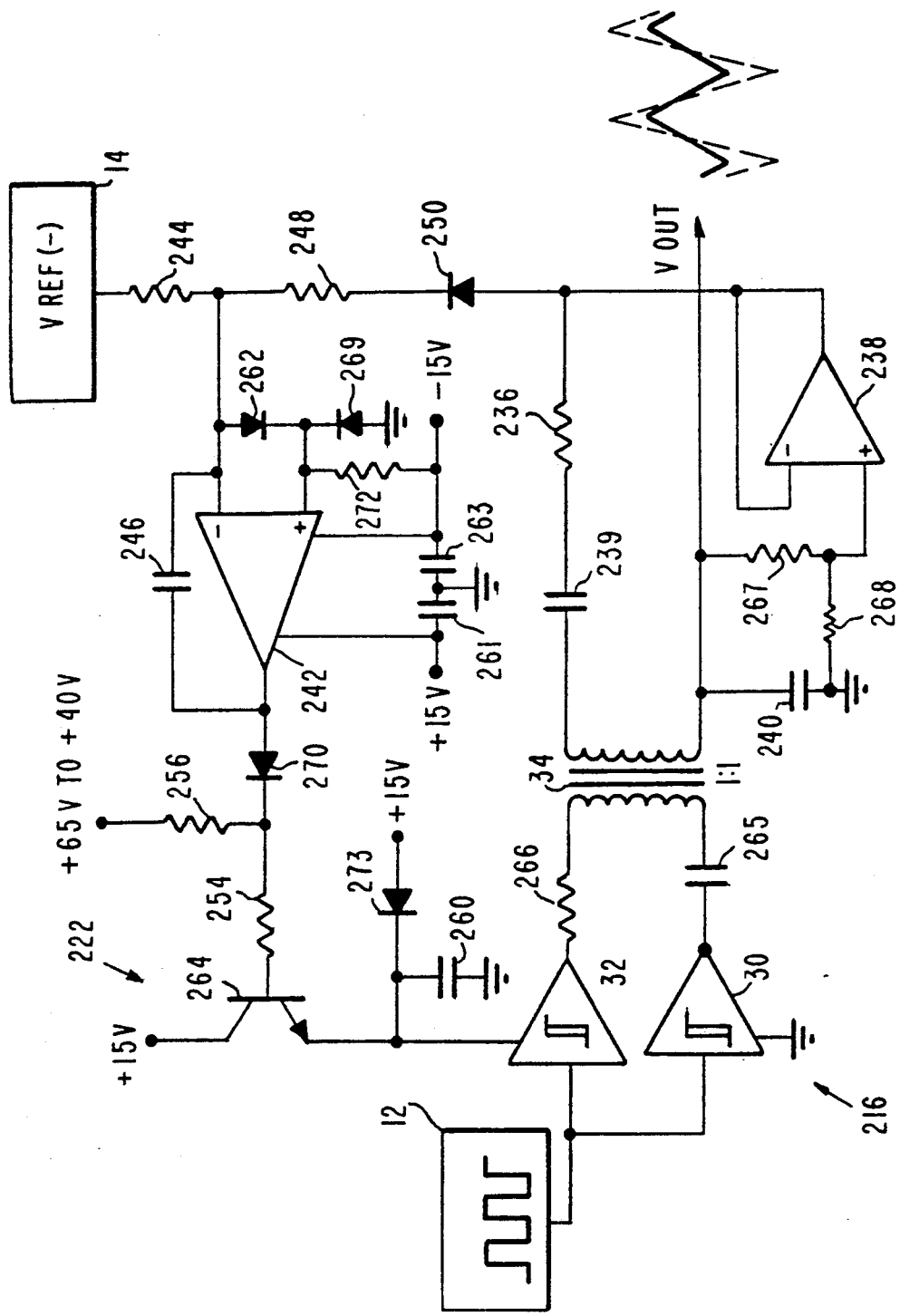
FIG. 3 illustrates a third embodiment of a programmable triangle wave generator in accordance with the present invention.
Figure 4:
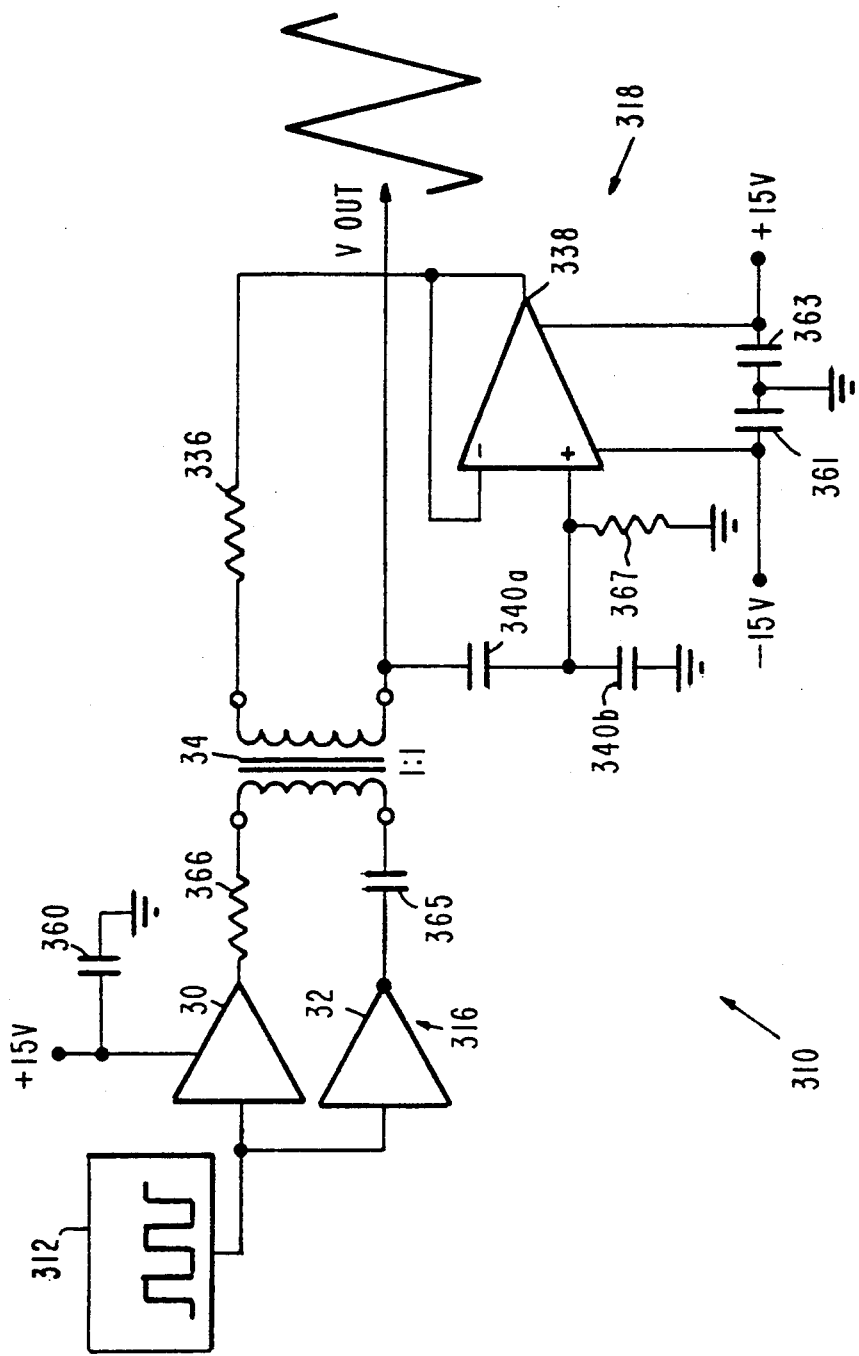
FIG. 4 illustrates a fourth embodiment of a programmable triangle wave generator in accordance with the present invention and suitable for use in fixed frequency applications that do not require programming of the triangle wave amplitude.

FIGS. 3 and 4 illustrate two other alternative embodiments of the present invention. The circuit of FIG. 3 is substantially the same as the circuits of FIGS. 1 and 2 with the amplifier and driver arrangement the same but the resistive and capacitive coupling being altered as shown. FIG. 4 illustrates a fourth embodiment suitable for use in fixed frequency applications that do not require programming of the triangle wave amplitude. The circuit of FIG. 3 will not be discussed in any detail herein, due to its clear presentation in the drawing.

As far as the implementation details of the circuit shown in FIG. 3 are concerned, the amplifiers and transistor are substantially the same as stated above with reference to FIGS. 1 and 2. The remainder of the components of this circuit are as follows. Capacitor 240 has a value of 680 pf, resistors 244 and 256 have values of 100 K ohm, resistor 267 has a value of 7.51 K ohm, resistor 236 has a value of 4.99 K ohm, capacitors 239, 260, 261, 263, and 265 have values of 0.1 µf, resistor 248 has a value of 3.83 K ohm, resistors 254 and 266 have a value of 51.1 ohm, resistor 268 has a value of 51.1 K ohm, resistor 272 has a value of 15 K ohm, diode 270 is a 1N4104, diodes 250, 262, 269 and 273 are 1N4150, and capacitor 246 has value of 0.01 µf.

With reference to FIG. 4, this circuit is similar to the circuit of FIG. 1, but the third amplifier 20, reference voltage signal source 14 and driver circuit 22 are eliminated. This circuit comprise a source of fixed frequency square wave input signals 312 coupled to a first amplifier 316. The output of the first amplifier 316 is resistively amplifier 318. The second amplifier 318 includes a capacitor divider circuit comprising two capacitors 340a, 340b coupled to its inputs, and the amplifier 318 is arranged in a unity gain configuration similar to the circuits of FIGS. 1 and 3.

In operation, the fixed frequency square waves are amplified by the first amplifier 316 and transformer coupled to the second amplifier 318. A triangle wave output signal is developed across the capacitors 340a, 340b and is attenuated by their voltage divider ratio. A fixed voltage output triangle wave signal is provided from this circuit in response to a fixed frequency square wave input signal.

In particular, the amplifiers are the same as stated above with reference to FIG. 1. The remainder of the components of this circuit are as follows. Capacitor 340a has a value of 4700 pf, capacitor 340b has a value of 680 pf, resistor 367 has a value of 150 K ohm, and resistor 336 has a value of 5.76 K ohm, capacitors 360, 361, 363, and 365 have values of 0.1 µf, resistor 366 has a value of 51.1 ohm.

The present invention also contemplates a method which includes the steps of providing a source of square wave current signals and a source of reference voltage signals. The method then provides for amplifying the square wave current signals and generating triangle wave output signals in response to the amplified square wave current output signals. Next, the method comprises sampling and comparing the amplitude of the triangle wave output signals to the reference voltage signals and generating output error signals in response thereto. Finally, the method comprises generating bias control signals in response to the output error signal to control the amplitude of the amplified square wave current output signals. The amplitude of these signals is approximately proportional to the amplitude of the reference voltage signals, multiplied by the frequency of the input square wave signals. This in turn controls the amplitude of the triangle wave output signals. Other more specific methods should be readily apparent from a reading of the above-disclosed embodiments.

The four disclosed circuit embodiments of the invention provide various levels of cost and performance. FIG. 2, for example, illustrates the maximum performance embodiment which can be configured by proper choice of component values to produce a 20 volt peak-to-peak triangle wave at frequencies to several hundred kilohertz. This is made practical by the very wide gain-bandwidth and high slew rate capability of the HA-5002 current buffer. The embodiment illustrated in FIG. 3 provides excellent performance at frequencies to approximately 200 kilohertz. FIG. 4 illustrates a low cost embodiment suitable for use in fixed frequency, fixed amplitude applications.

Although the present invention has been discussed in the context of switched mode servo amplifiers, the present invention has general uses for most applications requiring a triangle wave generator.

Thus there has been described a new and improved programmable triangle wave generator and method which provides variable amplitude, frequency independent, triangle waves over a wide frequency bandwidth while employing a low voltage power source. A non-programmable version of the circuit is also disclosed. It is to be understood that the above-described embodiments are merely illustrative of some of the many specific embodiments which represent applications of the principles of the present invention. Clearly, numerous and other arrangements can be readily devised by those skilled in the art without departing from the scope of the invention. An example of such an arrangement would be realized by substituting a single ended, but more powerful, MOSFET driver such as the TSC429 in place of the push-pull TSC428.

I claim:

1. A triangle wave generator comprising:
   a source of square wave input signals;
   a source of variable reference voltage signals;
   first amplifier means coupled to the square wave input source for amplifying the square wave input signals therefrom and a transformer means coupled to the first amplifier means for transmitting the amplified square wave output signals therefrom to an output of the transformer means:
   resistor and capacitor means coupled to the transformer means for generating a triangle wave signal; at the transformer means output, in response to the transmitted square wave output signals;
   second amplifier means coupled to the transformer for buffering and amplifying the triangle wave signal;
   said resistor and capacitor means including an attenuator means for preventing oscillation of the second amplifier; and
   third amplifier means for sampling and comparing the amplitude of the buffered and amplified triangle wave output signals to the amplitude of the variable reference voltage signals to generate output error signals in response thereto.

2. The triangle wave generator of claim 1 which further comprises:
   fourth amplifier means coupled to the second amplifier means for correcting voltage offset errors introduced by the second amplifier.

3. The triangle wave generator of claim 1 which further comprises:
   driver circuit means coupled to the third amplifier means for buffering and conditioning the output error signals and providing bias voltage signals to the first amplifier means which control the amplitude of the amplified square wave output signals in proportion to the amplitude of the reference voltage signals, thereby controlling the amplitude of the triangle wave output signals.

4. A programmable triangle wave generator comprising:
   a source of variable frequency square wave input signals;
   a source of variable amplitude reference voltage signals;
   first amplifier means coupled to the square wave input source for amplifying the square wave input signals;
   transformer means coupled to the first amplifier means for coupling the amplified square wave signal to a triangle wave forming network, said triangle wave forming network generating a triangle wave output signal at said transformer means;
   second amplifier means coupled to the transformer means for amplifying the triangle wave output signal;
   said triangle wave forming network including an attenuator means for preventing oscillation of the second amplifier means;
   third amplifier means for sampling and comparing the amplitude of the amplified triangle wave output signals to the amplitude reference voltage signals and generating output error signals.

5. The triangle wave generator of claim 4 which further comprises:
   driver circuit means for responding to the output error signals and for providing bias voltage signals to the first amplifier means to control the amplitude of the amplified square wave output signals in proportion to the product of the amplitude of the variable amplitude reference voltage signals and the frequency of the variable frequency square wave signal source, thereby controlling the amplitude of the triangle wave output signal, causing the amplitude to be proportional to the amplitude of the variable amplitude reference voltage signals and independent of the frequency of the square wave input signals.

6. A programmable triangle wave generator for use with a square wave input source and a control voltage source, said programmable triangle wave generator comprising:
   a first amplifier circuit having an input coupled to the square wave input source and having two outputs;
   transformer means having a primary winding coupled across the two outputs of the first amplifier circuit and a secondary coupled to a triangle wave forming circuit and providing a triangle wave signal;
   a second amplifier circuit arranged in a unity gain configuration and having an input coupled to the triangle wave forming circuit for buffering the triangle wave signal and thus forming a bootstrap circuit for improving the amplitude and linearity of the triangle wave signal;
   an said triangle wave forming circuit including attenuator circuit for preventing oscillation of the second amplifier circuit;
   a third amplifier circuit coupled in parallel to the second amplifier circuit and configured as an integrator for responding to and correcting triangle wave voltage offset introduced by said second amplifier;
   a fourth amplifier configured as an integrator and having inputs coupled to - the control voltage source, and to the output of the second amplifier, for comparing the amplitude of the triangle wave with the amplitude of the control voltage and for providing an error signal at its output indicative of the comparison; and
   a driver circuit coupled between a bias voltage source and the first amplifier circuit, and coupled to the output of the third amplifier for conditioning the error signal and providing a drive signal to the first amplifier circuit, a said driver circuit comprising transistor bias circuit controlling bias voltage applied to the first amplifier circuit which controls the amplitude of the square wave output thereof and hence the amplitude of the triangle wave output of the triangle wave forming circuit, the amplitude of the triangle wave being proportional to the control voltage and independent of the frequency of the square wave input signal;

whereby a variable amplitude triangle wave output is generated at the triangle wave forming circuit in response to changes in voltage from the control voltage source, and the frequency of the variable amplitude triangle wave is the frequency of the square wave input source.

7. A triangle wave generator for use with a square wave input source and a reference voltage source, said triangle wave generator comprising:

a bootstrapped integrator means comprising a transformer and resistor and capacitor means coupled to the square wave input source for generating a triangle wave in response to a square wave signal provided by the square wave input source;

first amplifier means having a unit gain follower configured and having an input coupled to the square wave input source and having an output coupled to the bootstrapped integrator means and said bootstrapped integrator means including attenuation means for preventing oscillation of a second amplifier means;

said second amplifier means coupled to the bootstrapped integrator means for amplifying the triangle wave current signals received from the bootstrapped integrator means;

third amplifier means coupled to the reference voltage source for comparing the amplitude of the triangle wave with the amplitude of the reference voltage to produce an error signal; and transistor driver means coupled to the first amplifier means for receiving the error signal from the third amplifier means and controlling the bias voltage applied to the first amplifier means to control the amplitude of the triangle wave voltage.

8. A method of providing a triangle wave comprising the steps of:

providing a source of square wave input signals;
providing a source of reference voltage signals;

amplifying the square wave input signals to provide amplified square wave output signals;

transmitting the amplified square wave output signals through a transformer;

generating triangle wave output signals in response to the amplified square wave output signals;

sampling and comparing the triangle wave output signals to the reference voltage and generating output error signals in response thereto; and generating bias control signals in response to the output error signals to control the amplitude of the amplified square wave output signals;

whereby the amplitude of the square wave output signals are proportional to the product of the frequency of the input square wave signal and the amplitude of the reference voltage signals, which in turn controls the amplitude of the triangle wave output signals.

9. A method for use with a source of square wave input signals and a source of reference voltage signals for providing a triangle wave, said method comprising the steps of:

amplifying square wave input signals provided by the source of square wave signals to provide amplified square wave output signals;

transmitting the amplified square wave output signals through a transformer, generating triangle wave output signals in response to the amplified square wave output signals;

sampling and comparing the triangle wave output signals to reference voltage signals provided by the source of reference voltage signals and generating output error signals in response thereto; and generating bias control signals in response to the output error signals to control the amplitude of the amplified square wave output signals;

whereby the amplitude of the square wave output signals are proportional to the product of the square wave input signal and the amplitude of the reference voltage signals, which is turn controls the amplitude of the triangle wave output signals.

* * * * *

UNITED STATES PATENT AND TRADEMARK OFFICE
CERTIFICATE OF CORRECTION

PATENT NO.   :   5,013,931

DATED        :   May 7, 1991

INVENTOR(S)  :   Earl M. Estes, Jr.

It is certified that error appears in the above-identified patent and that said Letters Patent is hereby corrected as shown below:

Claim 6, col. 10, line 43, delete first word "an" and insert --an-- after the word "including";
line 52, following the word "having" insert --its--;
line 62, delete "a";
line 63, insert --a-- preceeding the word "transistor";
col. 11, line 4, delete "circuit" and insert --network--.

Claim 8, col. 12, line 8, following the word "voltage" insert --signals--.

Claim 9, col. 12, line 27, replace "," with --;-- .

Signed and Sealed this

Third Day of November, 1992

Attest:

DOUGLAS B. COMER

Attesting Officer      Acting Commissioner of Patents and Trademarks